United States Patent [19]
Kim et al.

[11] Patent Number: 5,761,123
[45] Date of Patent: Jun. 2, 1998

[54] SENSE AMPLIFIER CIRCUIT OF A NONVOLATILE SEMICONDUCTOR MEMORY DEVICE

[75] Inventors: Myung-jae Kim; Tae-sung Jung, both of Kyungki-do, Rep. of Korea

[73] Assignee: Samsung Electronics, Co., Ltd., Kyungki-do, Rep. of Korea

[21] Appl. No.: 663,350

[22] Filed: Jun. 13, 1996

[30] Foreign Application Priority Data

Jun. 13, 1995 [KR] Rep. of Korea ............... 1995-15577
Jun. 30, 1995 [KR] Rep. of Korea ............... 1995-18965
Jun. 30, 1995 [KR] Rep. of Korea ............... 1995-18968

[51] Int. Cl.$^6$ .................................................. G11C 7/00
[52] U.S. Cl. .................. 365/185.21; 365/185.25; 365/202; 365/203; 365/207
[58] Field of Search ........................ 365/185.21, 185.25, 365/207, 202, 203

[56] References Cited

U.S. PATENT DOCUMENTS 5,444,662  8/1995  Tanaka et al. ............... 365/207 X
5,477,497  12/1995  Park et al. ................... 365/207 X
5,491,435  2/1996  Mun et al. ................... 365/207 X
5,539,701  7/1996  Shimizu ........................ 365/207

*Primary Examiner*—Do Hyun Yoo
*Attorney, Agent, or Firm*—Cushman Darby & Cushman IP Group of Pillsbury Madison & Sutro LLP

[57] ABSTRACT

A sense amplifier circuit for a nonvolatile semiconductor memory device, with NAND structured cells, includes a bit line isolation section located between a pair of bit lines connected to a memory cell array and a pair of sub-bit lines connected to an input/output gate circuit, a latch type voltage-controlled current source having n-channel MOS transistors connected to the sub-bit lines, and a switching section connected between the voltage-controlled current source and a signal line. The bit lines are electrically isolated from the sub-bit lines by provision of a bit line isolation section receiving an isolation control signal during the sensing operation. The sense amplifier circuit sensing operation is not affected by bit line load impedance and, accordingly, the sensing speed is improved and peak current is reduced.

23 Claims, 10 Drawing Sheets

SENSE AMPLIFIER CIRCUIT OF A NONVOLATILE SEMICONDUCTOR MEMORY DEVICE

BACKGROUND OF THE INVENTION

1. Field of the Invention

The present invention relates to a sense amplifier circuit of a nonvolatile semiconductor memory device, and more particularly to a sense amplifier circuit in a flash electrically erasable and programmable read-only memory (hereinafter referred to as an "EEPROM") with NAND structured cells.

2. Description of the Prior Art

Hard disk memories, which are mainly used as auxiliary memory devices in battery operated computer systems such as portable notebook computers, occupy relatively large areas of the computer systems. For this reason, designers of notebook computer systems are highly interested in the development of high density EEPROMs which exhibit excellent performance and do not take up too much space. Minimizing the size of the memory cells is one key to solving the space problem. Thus, use of an EEPROM with NAND structured cells has been proposed to reduce the number of selection transistors and contact holes to a bit line per a cell. An improved structure for the NAND EEPROM and the means for erasing and programming the NAND EEPROM are set forth in "A NAND STRUCTURED CELL WITH A NEW PROGRAMMING TECHNOLOGY FOR HIGHLY RELIABLE 5V-ONLY FLASH EEPROM" at pages 129–130 of the Symposium on VLSI Technology published in 1990. The NAND EEPROM reported in the paper has an operation mode for simultaneously erasing the information programmed in the memory cells. Such NAND EEPROMs are usually called flash EEPROMs or flash memories.

In the commonly used flash memory, zero voltage is applied to a gate terminal, i.e. a word line, of a selected cell transistor during a read operation. The bit line connected to the selected cell transistor is maintained at an initial precharge level in the case where the selected cell transistor is programmed to have positive threshold voltage. On the contrary, if the cell transistor is programmed to have negative threshold voltage, the bit line is discharged to ground level. The sense amplifier used in the flash memory can sense and amplify a very small difference between levels on the bit line and the reference bit line, the bit line being maintained at a precharge level or changed to ground level during the read operation.

FIG. 1 illustrates an example of a prior art sense amplifier circuit used in a flash EEPROM with folded bit line architecture, wherein sense amplifier circuit 1 is located between cell array 100 and input/output gate circuit 200. The cell array 100 includes a reference cell array for providing a reference voltage and input/output gate circuit 200 is provided to transmit the amplified data from sense amplifier circuit 1 to the input/output lines. In sense amplifier circuit 1, bit line isolation section 2 is located between bit lines BLi and BLj, which are connected to cell array 100, and the sub-bit lines SBLi and SBLj, which are connected to input/output gate circuit 200. The bit line isolation section 2 has n-channel metal oxide semiconductor field effect transistors Q1 and Q2 for selectively isolating bit lines BLi and BLj from sub-bit lines SBLi and SBLj. The sub-bit lines SBLi and SBLj are connected to n-latch sense amplifier section 3, having n-channel MOS transistors Q3 and Q4, p-latch sense amplifier section 4, having p-channel MOS transistors Q5 and Q6, precharging section 5 having p-channel MOS transistors Q7 and Q8, and equalizing section 6 having p-channel MOS transistor Q9, as shown in FIG. 1. To describe how this sense amplifier circuit operates, it is assumed that for convenience of description, a voltage developed in an erased cell which has been selected is applied to bit line BLi and a read reference voltage obtained from a reference cell which has been selected is applied to bit line BLj.

FIG. 2 is a timing chart illustrating a sensing operation of the sense amplifier circuit. In FIG. 2, bit lines BLi and BLj and latch amplifier driving lines LA and /LA are precharged to source voltage $V_{cc}$, and sub-bit lines SBLi and SBLj are also precharged to $V_{cc}$ by precharge control signal/$\phi$EQ. When the voltages of bit lines BLi and BLj sufficiently develop in accordance with cell selection, isolation control signal ISO having a pulse waveform is generated. When signal ISO is generated, isolation transistors Q1 and Q2 are turned on and the voltage of n-latch sense amplifier driving line /LA decreases to ground voltage (GND), or 0V. To prevent a voltage drop on the bit lines, through isolation transistors Q1 and Q2, isolation control signal ISO must be maintained at a high level, over $V_{cc}+2V_{m}$, where $V_m$ indicates the threshold voltage of the n-channel MOS transistor. When isolation transistors Q1 and Q2 are turned on, the voltages of the sub-bit lines are changed, owing to the charge sharing between bit lines BLi and BLj and sub-bit lines SBLi and SBLj. As the voltage of sub-bit line SBLi, which is coupled with bit line BLi and thereby electrically connected to the erased cells, is decreased relatively quickly, transistors Q3 and Q6 are turned on. As a result, the voltage of sub-bit line SBLi falls to ground and that of sub-bit line SBLj pulls up to $V_{cc}$ via latch amplifier driving lines LA and /LA. The very small difference between potential levels on bit lines BLi and BLj is sensed and amplified by sense amplifier circuit 1 and transmitted to input/output gate circuit 200.

Hence, for the above-described sense amplifier circuit 1 during a sensing operation, there are the limitations that isolation control signal ISO must be a pulse waveform and its high level must be controlled over $V_{cc}+2V_{tn}$. Additionally, sense amplifier circuit 1 is affected by the bit line load in the cell array, which causes slower sensing speeds and increases in peak current. The terminology "bit line load" means the load impedance along the data path (i.e., bit lines) at the side of the cell array. Only the normal sensing operation is performed in sense amplifier circuit 1, but the inverted sensing operation where the data memorized in a selected cell is inversely outputted can not be performed in the circuit, which limits the design of the input/output circuit.

FIG. 3 shows another conventional sense amplifier circuit used in a flash EEPROM with folded bit line architecture. In FIG. 3, the flash EEPROM has cell array 100 which is located between precharging section 7, having p-channel MOS transistors Q10 and Q11, and equalizing section 8, having n-channel MOS transistor Q12. Bit line isolation section 9, having n-channel MOS transistors Q13 and Q14, is connected between bit lines BLi and BLj and sub-bit lines SBLi and SBLj. Electrical connection of the bit lines to the sub-bit lines is selectively performed by bit line isolation section 9. Sub-bit lines SBLi and SBLj are commonly connected to n-latch sense amplifier section 10, having two n-channel MOS transistors Q15 and Q16, and p-latch sense amplifier section 11, having two p-channel MOS transistors Q17 and Q18. The drains of transistors Q15 and Q16 are commonly connected to a latch amplifier driving line $V_{sal}$, and the sources of transistors Q17 and Q18 are commonly connected to latch amplifier driving line $V_{sah}$.

FIG. 4 is a timing chart showing a sensing operation during the read mode of the sense amplifier shown in FIG. 3. The voltage of bit line BLi develops in accordance with the state of a cell which is selected by word line signal WL. Then if the selected cell is an off-cell, or a programmed cell, the cell transistor selected thus has positive threshold voltage. Accordingly, the selected cell transistor is turned off when a word line selection signal of zero volt is applied to its gate, and the voltage of bit line BLi is maintained at the precharge level. However, if the selected cell is an on-cell, or an erased cell, the selected cell transistor requires a negative threshold voltage to be turned on, even though the word line selection signal of zero volts is applied to its gate. As a result, bit line BLi voltage is lower than that of bit line BLj connected to a reference cell. Then, isolation control signals, ISOi and ISOj, of predetermined pulse duration are generated and isolation transistors Q13 and Q14 are turned on. While isolation control signals ISOi and ISOj, having pulse waveforms, are activated, the voltage of n-latch sense amplifier driving line $V_{sal}$ is lowered from a precharge high level to a low level and that of p-latch sense amplifier driving line $V_{sah}$ is increased from a precharge low level to a high level. Thus, the data of bit line BLi are detected by sense amplifier sections 10 and 11. Accordingly, the minute difference between the voltage levels on bit lines BLi and BLj is amplified by sense amplifier circuit 1 and transmitted to input/output gate circuit 200.

FIG. 5 is a timing chart illustrating the sensing operation of the sense amplifier circuit during program verification and inhibition modes of the flash memory shown in FIG. 3. Herein, the program verification mode means that when a negative threshold voltage of a selected on-cell shifts to a positive threshold voltage, a programming operation continues until the threshold voltage detected from the on-cell reaches a preset threshold voltage. The program inhibition mode means that unselected cells are not programmed during a programming operation.

In order that the on-cell connected to selected bit line BLi is not programmed during the programming operation, the voltage of sub-bit line SBLi, corresponding to selected bit line BLi, has to be maintained at $V_{cc}$. As shown in FIG. 5, isolation control signal ISOj is activated under the condition that sub-bit lines SBLi and SBLj are precharged, respectively, to $V_{cc}$ and GND (zero Volts) by an externally applied data signal from I/O gate circuit 200 during the program inhibition mode, and then unselected bit line BLj connected to the reference cell is discharged to GND. At this time, latch driving signals $V_{sal}$ and $V_{sah}$ are inactivated. Thus, in the following read operation, because the voltage of sub-line SBLj is previously set to GND even though a voltage of bit line BLi connected to the on-cell is lowered to a low level, the voltage of sub-line SBLi is maintained at $V_{cc}$.

Also, during the programming operation of the on-cell, or erased cell, connected to selected bit line BLi, sub-bit lines SBLi and SBLj are precharged, respectively, to GND and $V_{cc}$ by the externally applied data signal, and the same operation as in the program verification mode is carried out As the voltage of sub-bit line SBLi shifts from GND to $V_{cc}$ in the following read operation of cells, the program inhibition mode is effective and the programming operation is automatically terminated.

During a sensing operation of the bit line, there are changes in the sensing margin and the decoupling margin between the bit lines and the sub-bit lines according to the process parameters and the overlapping degree of isolation control signals ISOi and ISOj and latch driving signals $V_{sal}$ and $V_{sah}$.

Moreover, since isolation transistor Q14 connected to the bit line BLj has to be previously turned on during the program verification and inhibition modes, there are problems in that additional control logic is required for the sense amplifier circuit and the time required for the program verification mode is prolonged.

SUMMARY OF THE INVENTION

Therefore, it is an object of the present invention to provide a sense amplifier circuit of a nonvolatile semiconductor memory device with folded bit line architecture, in which a stable sensing operation may be performed without using bit line isolation signals having pulse waveforms.

It is another object of the invention to provide a sense amplifier circuit which is not affected by the load impedance of the bit line connected to memory cells in the nonvolatile semiconductor memory device with folded bit line architecture.

It is a further object of the invention to provide a sense amplifier circuit having low power consumption.

It is another object of the invention to provide a sense amplifier circuit for a flash memory device which is capable not only of a normal sensing operation but also of an inverted sensing operation.

It is still a further object of the invention to provide a sense amplifier circuit for a flash memory device which is suitable to minimize the changes in decoupling and sensing margins during a sensing operation of the bit lines.

It is another object of the invention to provide a sense amplifier circuit for a flash memory device which is capable of carrying out a high speed sensing operation.

It is still another object of the invention to provide a sense amplifier circuit for a flash memory device which is suitable for program verification and inhibition.

According to one aspect of the present invention, a sense amplifier circuit for a nonvolatile semiconductor memory device, having an NAND structured memory cell array for storing information and a reference cell array for providing a reference voltage, is provided with a pair of bit lines connected to the NAND structured memory cell array and the reference cell array, respectively; a pair of sub-bit lines corresponding to the bit lines, respectively; bit line isolating means for electrically and selectively isolating the bit lines from the sub-bit lines in response to an externally applied isolation control signal; means for precharging and equalizing the sub bit lines during a precharging period; a signal line for receiving an externally applied voltage signal; a voltage-controlled current source having first and second current paths connected to the sub-bit lines, respectively, for adjusting a current amount flowing through the second current path in accordance with a voltage level of one of the bit lines and adjusting a current amount flowing through the first current path in accordance with a voltage level of the other bit line; switching means for electrically and selectively connecting one of the first and second current paths to the signal line in response to a switching control signal; and amplifier means for amplifying voltage levels of the sub-bit lines to first and second predetermined voltage levels, respectively, when a potential difference between the sub-bit lines is more than a predetermined voltage.

According to another aspect of the present invention, a sense amplifier circuit for a nonvolatile semiconductor memory device, having an NAND structured memory cell array for storing information and a reference cell array for providing a reference voltage, is provided with a pair of bit lines connected to the NAND structured memory cell array and the reference cell array, respectively; means for precharging and equalizing the sub-bit lines during a precharging period; a pair of sub-bit lines corresponding to the bit lines, respectively, and precharged by externally applied data signals; bit line isolating means for electrically and selectively isolating the bit lines from the sub-bit lines in response to an externally applied isolation control signal; a voltage-controlled current source having first and second current paths connected to the sub-bit lines, respectively, for adjusting a current amount flowing through the second current path in accordance with a voltage level of one of the bit lines and adjusting a current amount flowing through the first current path in accordance with a voltage level of the other bit lines; a constant voltage source for supplying a constant voltage signal; switching means for electrically and selectively connecting one of the first and second current paths to the constant voltage source in response to first and second switching control signals, respectively; and amplifier means for amplifying voltage levels of the sub-bit lines to first and second predetermined voltage levels, respectively, when a potential difference between the sub-bit lines is more than a predetermined voltage.

BRIEF DESCRIPTION OF THE ATTACHED DRAWINGS

This invention may be better understood and its objects will become more readily apparent to those skilled in the art by reference to the accompanying drawings, as follows.

DETAILED DESCRIPTION OF THE PREFERRED EMBODIMENTS

For convenience of description, it is assumed that a voltage developed in an erased cell which is selected is applied to bit line BLi and a read reference voltage obtained from a reference cell which is selected is applied to bit line BLj.

EXAMPLE 1

Figure 1:
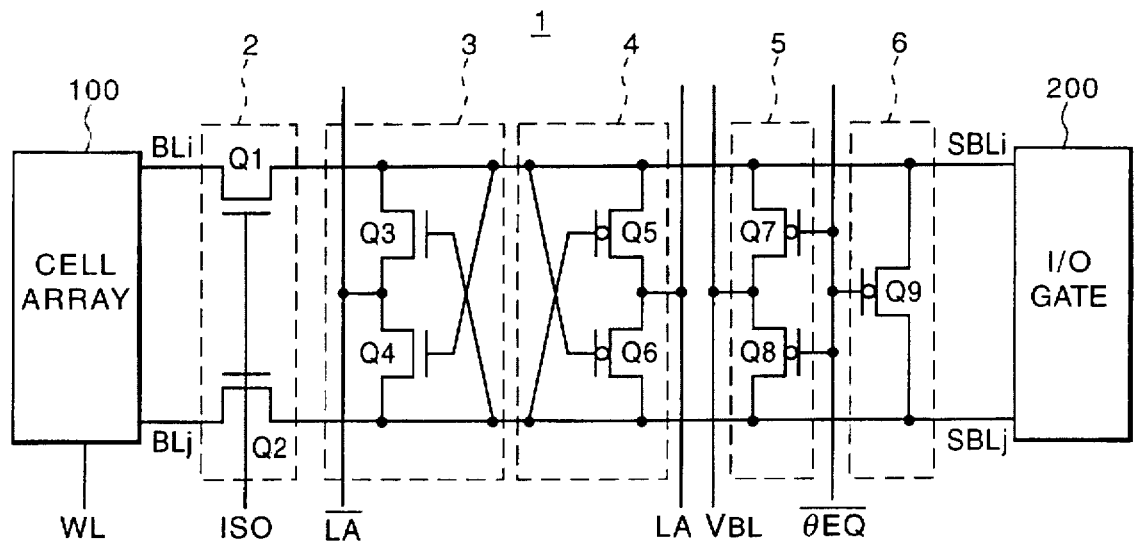
FIG. 1 is a circuit diagram showing a prior art sense amplifier for a nonvolatile semiconductor memory device.
Figure 2:
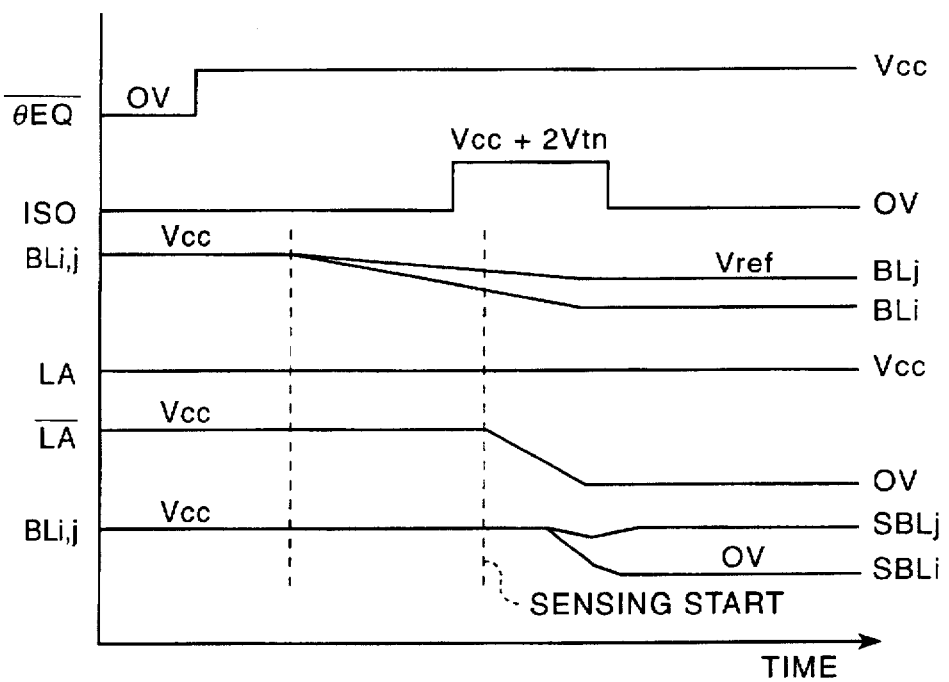
FIG. 2 is a timing chart showing the sensing operation of the sense amplifier shown in FIG. 1.
Figure 3:
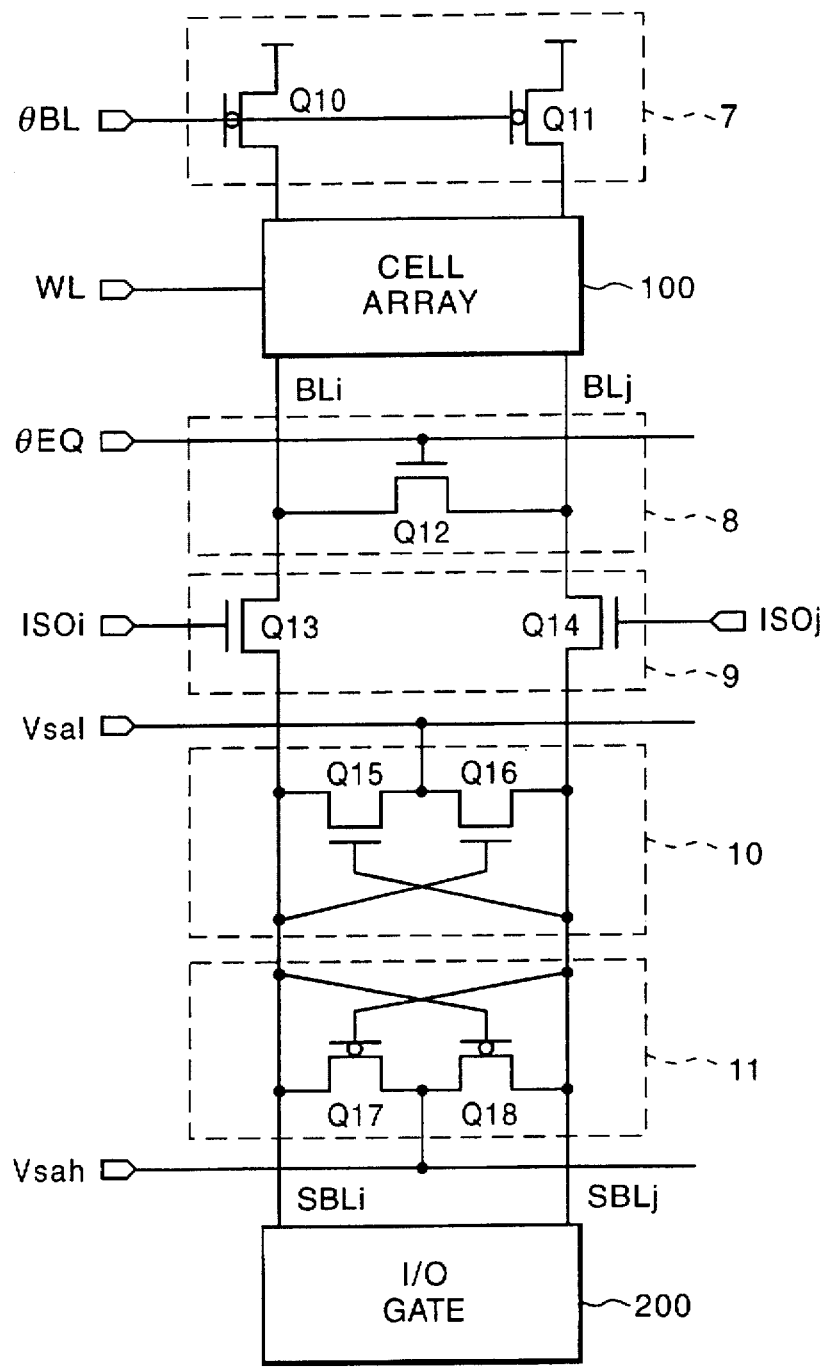
FIG. 3 is a circuit diagram showing another prior art sense amplifier for a nonvolatile semiconductor memory device.
Figure 4:
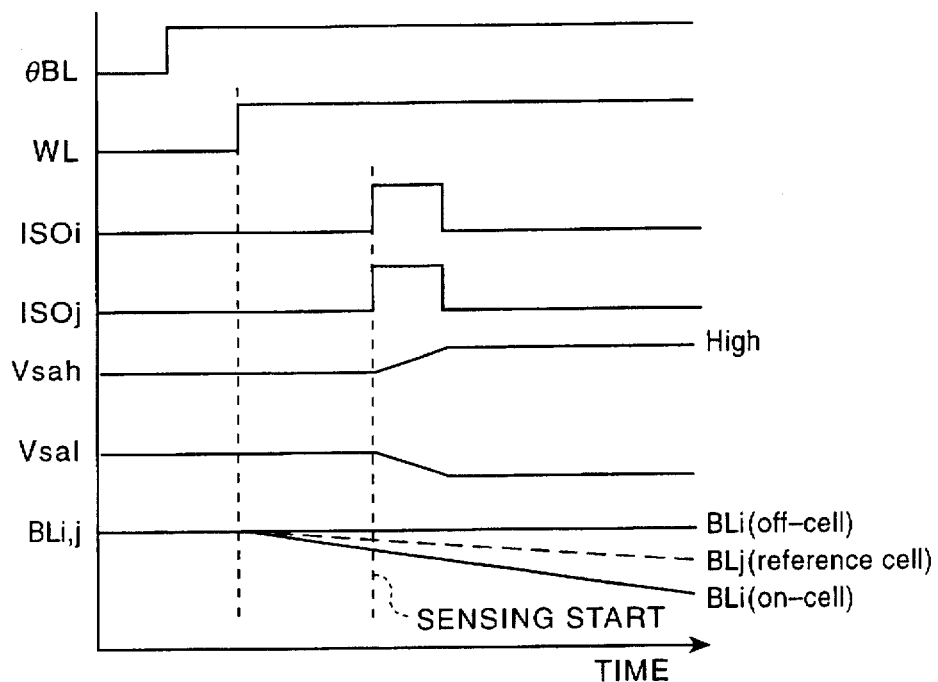
FIG. 4 is a timing chart showing the sensing operation in a read mode of the sense amplifier shown in FIG. 3.
Figure 5:
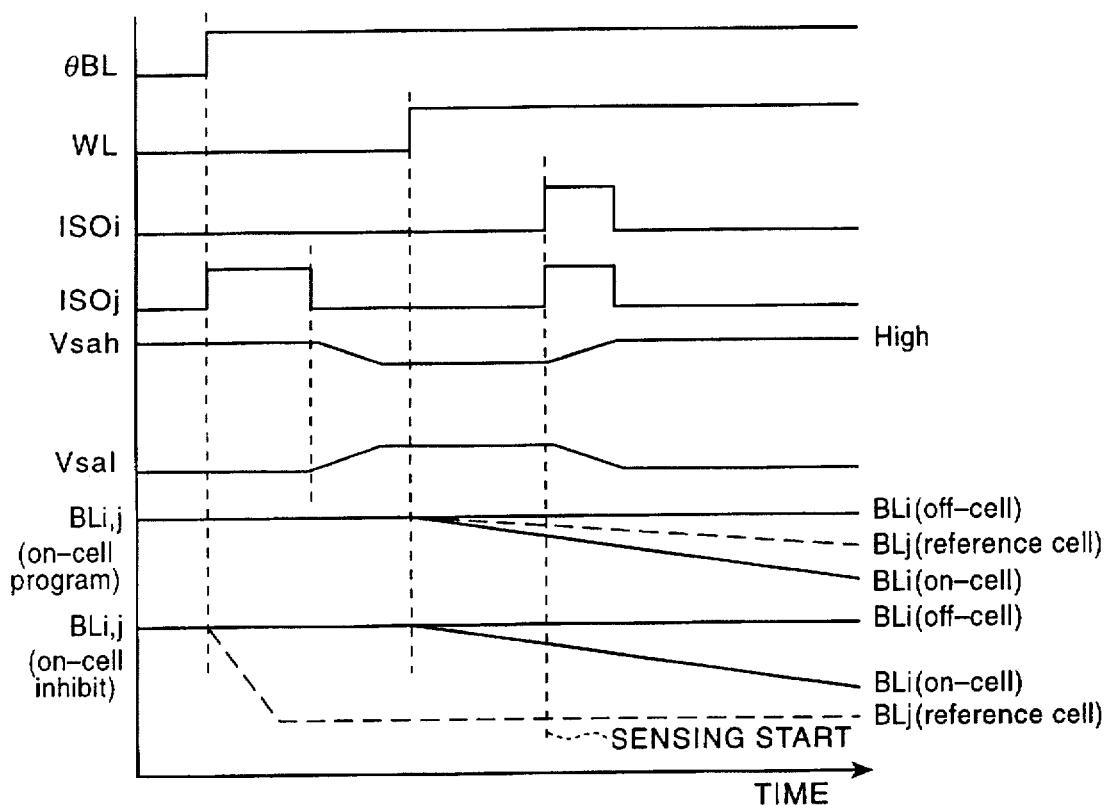
FIG. 5 is a timing chart showing the sensing operation in program verification and inhibition modes of the sense amplifier shown in FIG. 3.
Figure 6:
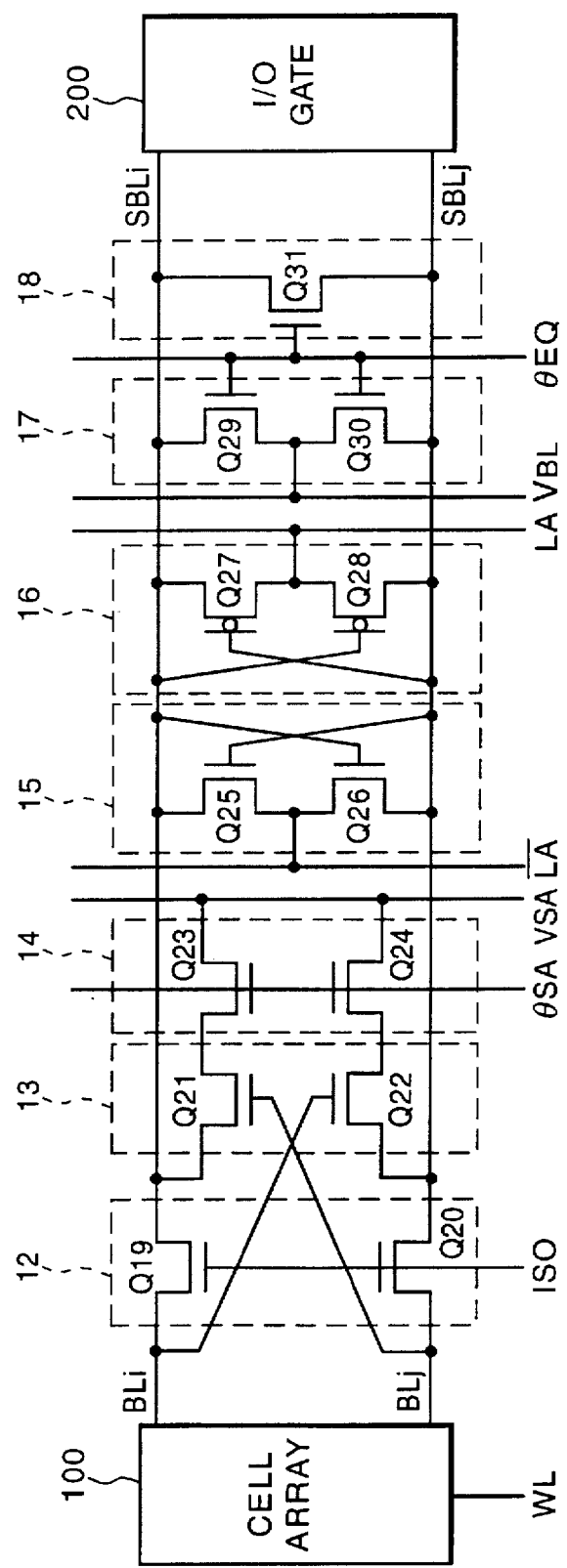
FIG. 6 is a circuit diagram showing the construction of a sense amplifier for a nonvolatile semiconductor memory device in accordance with an embodiment of the present invention.

FIG. 6 shows a sense amplifier circuit for a flash memory device with folded bit line architecture according to a preferred embodiment of the present invention. In FIG. 6, the sense amplifier circuit is located between input/output gate circuit 200 and cell array 100, which includes a NAND structured memory cell array for storing input data and a reference cell array for providing a reference voltage to the bit lines. The sense amplifier circuit has bit line isolating section 12 which is constituted by two n-channel MOS transistors Q19 and Q20 and located between bit lines BLi and BLj and sub-bit lines SBLi and SBLj. Bit lines BLi and BLj are connected to cell array 100 and sub-bit lines SBLi and SBLj are connected to input/output gate circuit 200. An isolation control signal ISO is applied to the gates of transistors Q19 and Q20. The respective bit lines BLi and BLj are electrically and selectively isolated from sub-bit lines SBLi and SBLj by bit line isolating section 12. Sub-bit lines SBLi and SBLj are connected to voltage-controlled current source 13, having a latch structure and comprising n-channel MOS transistors Q21 and Q22. Switching section 14, having n-channel MOS transistors Q23 and Q24, is connected between voltage-controlled current source 13 and signal line VSA. The drain and source of transistor Q21 are connected, respectively, to sub-bit line SBLi and the drain of transistor Q23, and the gate of transistor Q21 is commonly connected to bit line BLj and the drain of isolation transistor Q20. The drain and source of transistor Q22 are connected, respectively, to sub-bit line SBLj and the drain of transistor Q24, and the gate is commonly connected to bit line BLi and the drain of isolation transistor Q19. The sources of transistors Q23 and Q24 of switching portion 14 are commonly connected to signal line VSA and the gates receive switching control signal φSA having a pulse waveform.

Additionally, sub-bit lines SBLi and SBLj are connected to n-latch sense amplifier section 15, having n-channel MOS transistors Q25 and Q26, p-latch sense amplifier section 16, having p-channel MOS transistors Q27 and Q28, precharging section 17, having n-channel MOS transistors Q29 and Q30, and equalizing section 18, comprising n-channel MOS transistor Q31.

Figure 7:
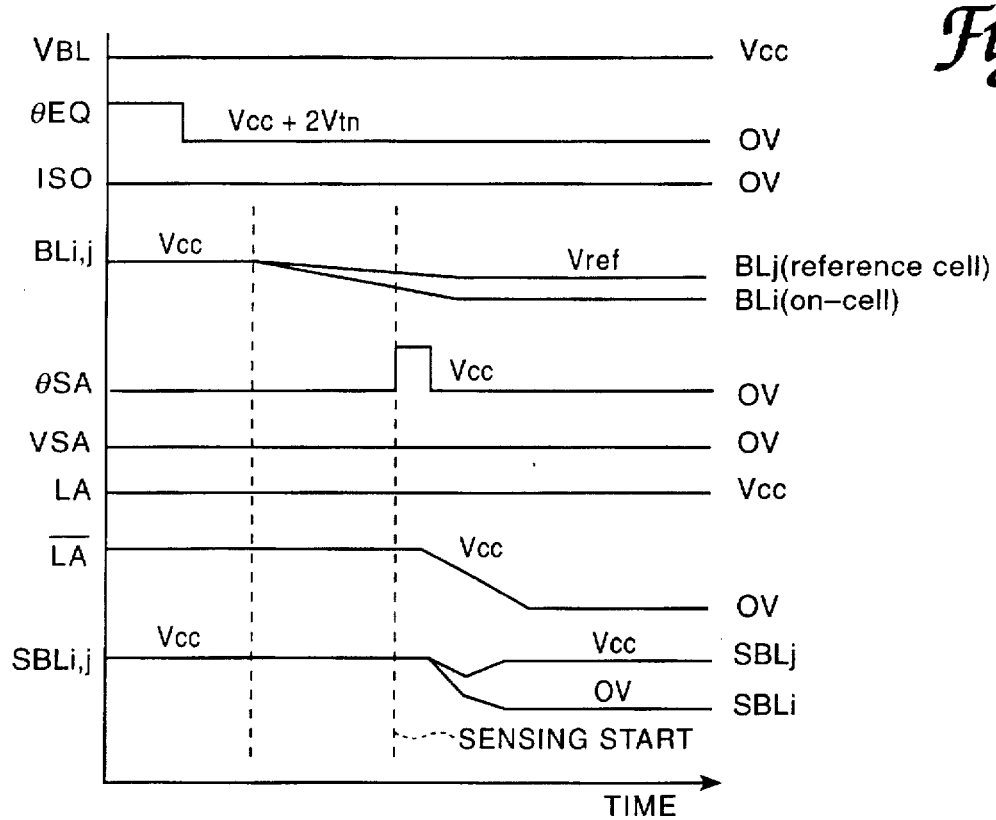
FIG. 7 is a timing chart showing a normal sensing operation of the sense amplifier shown in FIG. 6.

As can be seen in FIG. 7, bit lines BLi and BLj are precharged to $V_{cc}$, and sub-bit lines SBLi and SBLj are also precharged to $V_{cc}$, by precharging section 17 and equalizing section 18, while precharging and equalizing control signal 100 EQ is maintained at $V_{cc}+2V_{m}$, where $V_{m}$ represents the threshold voltage of an n-channel MOS transistor. During this sensing operation, the voltages of signal line VSA and p-latch sense amplifier driving line LA are precharged, respectively, to GND and $V_{cc}$, and n-latch sense amplifier driving line /LA is maintained at $V_{cc}$ before the pulsed switching control signal $\phi SA$ is generated. In this condition, a memory cell is selected by word line signal WL. According to the state of the selected memory cell, for example, on-cell or off-cell, the respective voltages of the bit lines develop. Then, when there is a potential difference between bit lines BLi and BLj, that is, if the voltage of bit line BLi gets lower than that of bit line BLj, switching control signal $\phi SA$ is activated. As a result, a sensing operation for detecting the potential difference therebetween is started.

If switching control signal $\phi SA$ is shifted to a high level, transistors Q23 and Q24 are turned on and sub-bit line SBLi is discharged faster than sub-bit line SBLj by transistor Q21, because the voltage of bit line BLj is higher than that of bit line BLi. As a result, the voltage of SBLi is lower than that of SBLj. The voltage of n-latch sense amplifier driving line /LA shifts from $V_{cc}$ to GND and that of p-latch sense amplifier driving line LA is maintained at $V_{cc}$, so that transistors Q25 and Q28 are turned on and the voltages of sub-bit lines SBLi and SBLj are shifted, respectively, to GND and $V_{cc}$. In this manner, the minute potential difference between bit lines BLi and BLj is amplified by the sense amplifier circuit.

As shown again in FIG. 7, the sensing operation is performed under the condition that signal line VSA is precharged to GND and sub-bit lines SBLi and SBLj are precharged to $V_{cc}$. It is understood, for example, in FIG. 7 that the voltages of sub-bit lines SBLi and SBLj are developed, respectively, to GND and $V_{cc}$ in the case of the on-cell data sensing operation in which bit lines BLi and BLj are developed, respectively, to GND and the reference voltage $V_{ref}$. As can be seen from the above description, data having the same phase as the cell data may be accessed by the sense amplifier circuit of the present invention.

In the first embodiment, switching control signal $\phi SA$ is a pulse waveform, as shown in FIG. 7, so as not to continuously form a DC current path from sub-bit lines SBLi and SBLj through voltage-controlled current source 13 and switching section 14 to GND (that is signal line VSA) by developed bit lines BLi and BLj after a substantial sensing operation. Also, because isolation control signal ISO is inactivated and maintained at GND during the sensing operation, bit lines BLi and BLj are electrically and completely isolated from the sense amplifier circuit, so that the sensing operation is not affected at all by the bit line load. As a result, sensing speed is improved and peak current is reduced.

Figure 8:
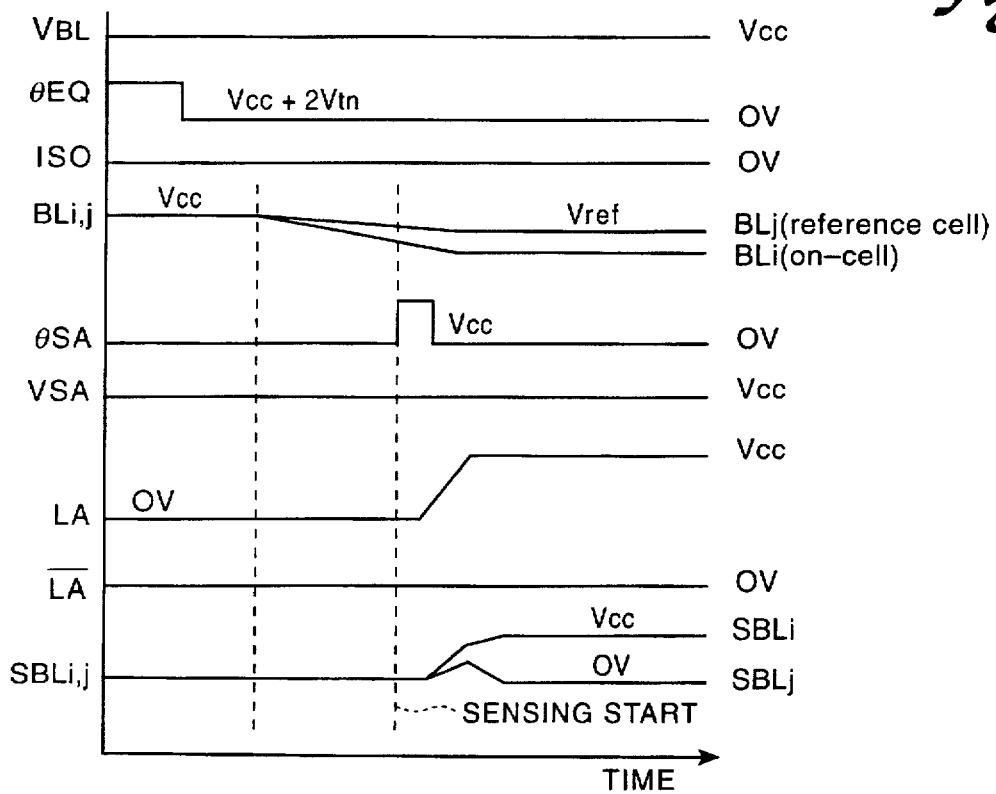
FIG. 8 is a timing chart showing an inverted sensing operation of the sense amplifier shown in FIG. 6.

In FIG. 8, a timing chart for the inverted sensing operation of the sense amplifier circuit is illustrated. As shown in FIG. 8, bit lines BLi and BLj are precharged to the $V_{cc}$ level. While precharging and equalizing control signal $\phi EQ$ is maintained at $V_{cc}+2V_m$, sub-bit lines SBLi and SBLj are precharged to GND by precharging section 17 and equalizing section 18. During the inverted read operation, signal line VSA and p-latch sense amplifier driving line LA are maintained, respectively, at the $V_{cc}$ and GND levels, and both latch amplifier driving lines LA and /LA continue to be maintained at GND before switching control signal $\phi SA$ is generated as a pulse waveform, so that a memory cell is selected by word line signal WL. As a potential difference between bit lines BLi and BLj is generated, switching control signal $\phi SA$ is activated.

If switching control signal $\phi SA$ is shifted from a low level to a high level, transistors Q23 and Q24 are turned on and the sensing operation is started. Because the voltage of bit line BLj is higher than that of bit line BLi, sub-bit line SBLi is charged faster than SBLj. As a result, the voltage of SBLi is higher than that of SBLj.

At this time, the voltage of p-latch sense amplifier driving line LA also is shifted from GND to $V_{cc}$ and that of n-latch sense amplifier driving line /LA continues to be maintained at GND, so that transistors Q26 and Q27 are turned on. Thus, the voltages of sub-bit lines SBLi and SBLj are developed, respectively, to $V_{cc}$ and GND and a very small difference in potential level between bit lines BLi and BLj is sensed and amplified by the sense amplifier circuit.

As mentioned above, the sensing operation is performed under the condition that signal line VSA is precharged to the $V_{cc}$ level and sub-bit lines SBLi and SBLj are precharged to GND, as shown in FIG. 8. As the voltages of sub-bit lines SBLi and SBLj are developed, respectively, to the GND and $V_{cc}$ levels in the case of the sensing of on-cell data, the voltages of bit lines BLi and BLj are developed, respectively, to GND and reference voltage $V_{ref}$. As can be seen from the above description, data which is opposite in phase to cell data may be accessed by the sense amplifier circuit, according to the first embodiment of the present invention.

Figure 9:
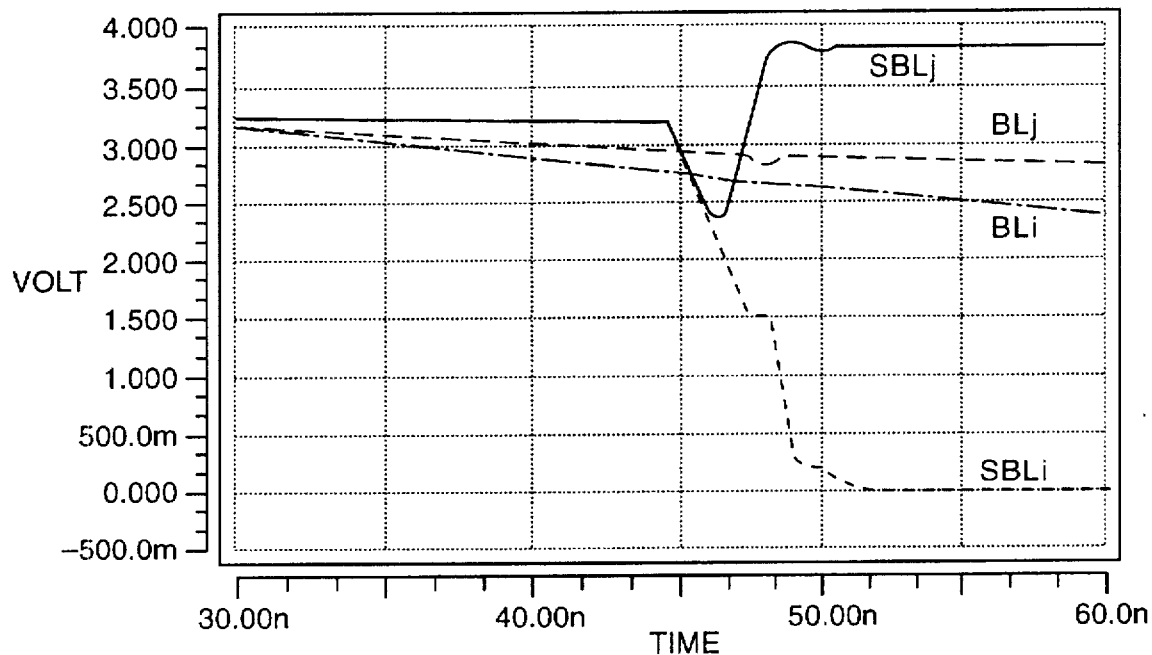
FIG. 9 is a diagram showing waveforms of the bit line voltage as a result of simulation of the normal sensing operation of the sense amplifier shown in FIG. 6.
Figure 10:
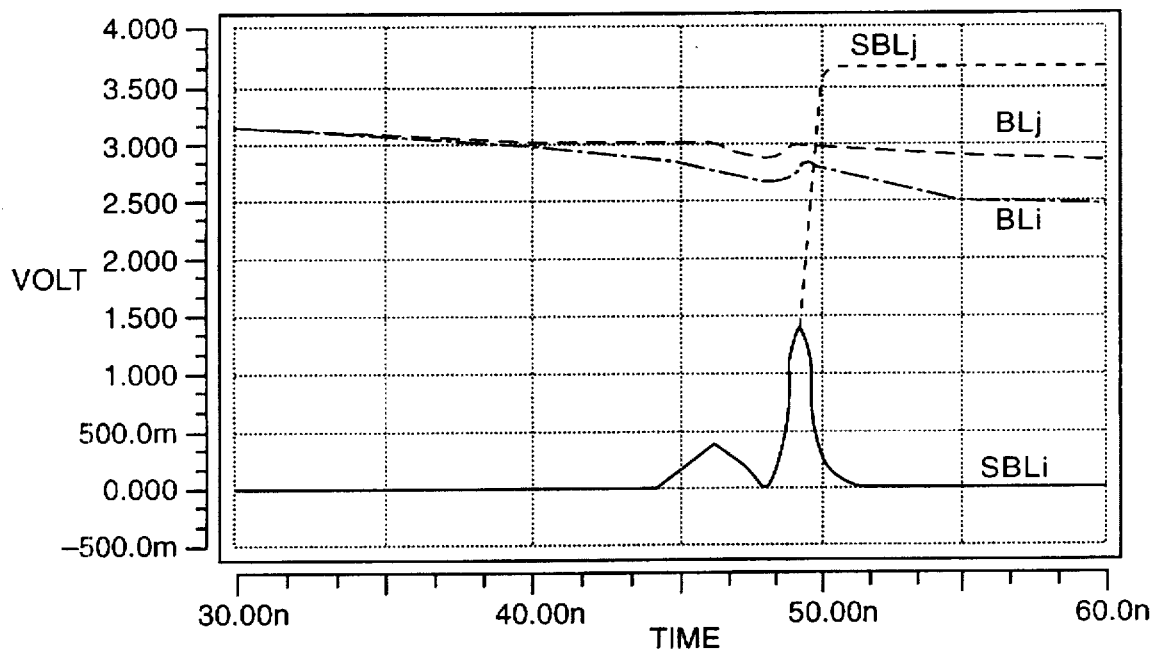
FIG. 10 is a diagram showing waveforms of the bit line voltage as a result of simulation of the inverted sensing operation of the sense amplifier shown in FIG. 6.

FIGS. 9 and 10 show simulated voltage waveforms of the bit lines for the normal and the inverted sensing operations of the invention. The simulation is performed under the condition that the power voltage $V_{cc}$ is 3.8V and the temperature is about $-5°$ C. The sense amplifier circuit and the cell array stage connected through the bit lines BLi and BLj are electrically isolated during the above sensing operations, so that the sensing speed can be further improved and minimized peak current flows through the sense amplifier circuit.

As described above, the sense amplifier circuit according to the first embodiment of the present invention may carry out a stable sensing operation at a higher speed without a bit line pulsed isolation signal being applied to the bit line isolation section.

Also the peak current flowing through the sense amplifier circuit is significantly reduced. Moreover, because both normal and inverted sensing operations can be performed, the design of the nonvolatile memory device is not limited.

EXAMPLE 2

Figure 11:
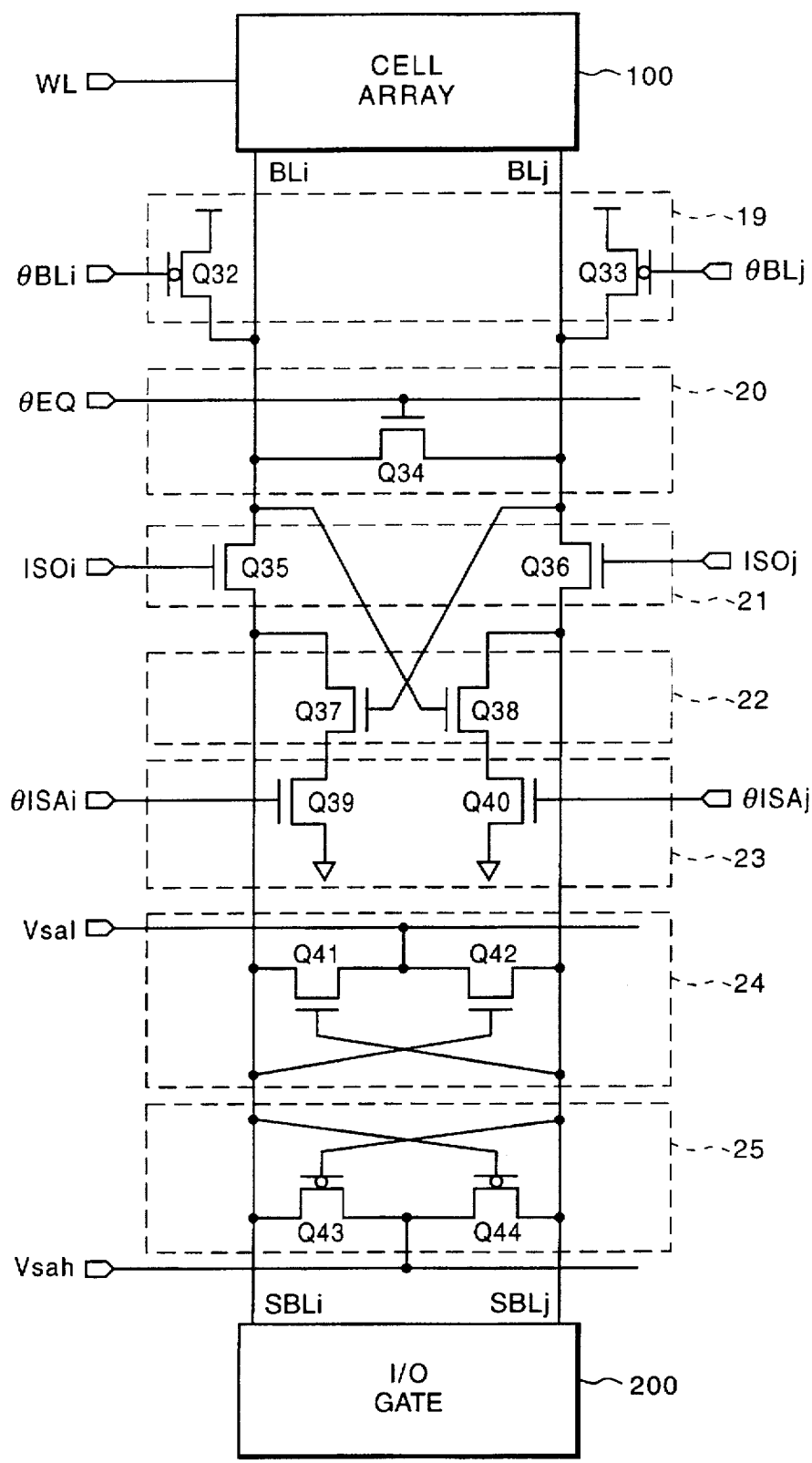
FIG. 11 is a circuit diagram showing the construction of a sense amplifier for a nonvolatile semiconductor memory device in accordance with another embodiment of the present invention.

FIG. 11 shows a sense amplifier circuit for a flash memory device with folded bit line architecture according to a second embodiment of the present invention.

As shown in FIG. 11, the sense amplifier circuit is located between input/output gate circuit 200 and cell array 100, having a memory cell array and a reference cell array. The circuit includes bit line isolation section 21 which is constituted by n-channel MOS transistors Q35 and Q36 and located between bit lines BLi and BLj and sub-bit lines SBLi and SBLj. Bit lines BLi and BLj are connected to cell array 100 and sub-bit lines SBLi and SBLj are connected to input/output gate circuit 200.

As further shown in FIG. 11, bit lines BLi and BLj are connected to precharging section 19, having p-channel MOS transistors Q32 and Q33, and equalizing section 20, having n-channel MOS transistor Q34. Sub-bit lines SBLi and SBLj are connected to voltage-controlled current source 22, having n-channel MOS transistors Q37 and Q38. Switching section 23 is connected between voltage controlled current source 22 and ground (or a potential lower than $V_{cc}$). Switching section 23 is constituted by two n-channel MOS transistors Q39 and Q40.

In voltage-controlled current source 22, the drain and source of transistor Q37 are connected, respectively, to sub-bit line SBLi and the drain of transistor Q39, and the gate is commonly connected to bit line BLj and the drain of isolation transistor Q36. The drain and source of transistor Q38 are connected, respectively, to sub-bit line SBLj and the drain of transistor Q40, and the gate is commonly connected to bit line BLi and the drain of isolation transistor Q35. The sources of transistors Q39 and Q40 are commonly connected to ground or a terminal for receiving a voltage lower than $V_{cc}$ and the gates receive switching control signals φSAi and φSAj having pulse waveforms. An n-latch sense amplifier section 24, having n-channel MOS transistors Q41 and Q42, and p-latch sense amplifier section 25, having p-channel MOS transistors Q43 and Q44, are commonly connected to sub-bit lines SBLi and SBLj.

The sensing operation of the sense amplifier circuit of FIG. 11 will now be described with reference to the timing chart of FIG. 12.

Figure 12:
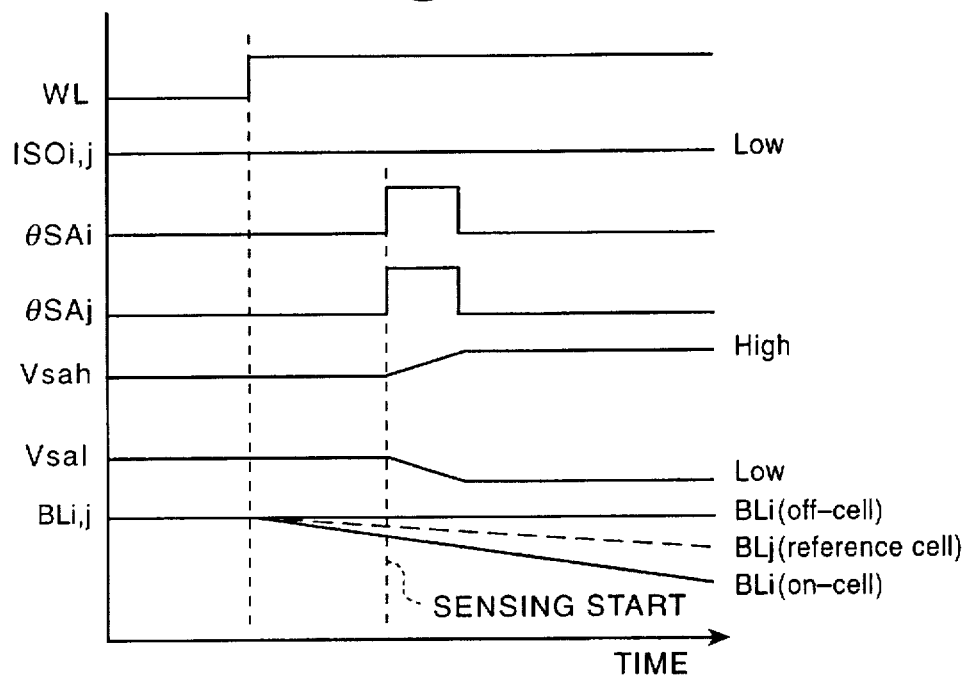
FIG. 12 is a timing chart showing the sensing operation in a read mode of the sense amplifier shown in FIG. 11.

As shown in FIG. 12, bit lines BLi and BLj are precharged to $V_{cc}$, while word line signal WL is at a low level. Then, isolation control signals ISOi and ISOj and p-latch sense amplifier driving line $V_{sah}$ are maintained at ground, and n-latch sense amplifier driving line $V_{sal}$ is maintained at $V_{cc}$. In this state, a memory cell is selected by the shift of word line signal WL to a high level. In FIG. 12, the voltages of bit lines BLi and BLj are developed and a very small potential difference is generated between them. Switching control signals φSAi and φSAj are activated, and p-latch sense amplifier driving line $V_{sah}$ and n-latch sense amplifier driving line $V_{sal}$ are shifted from their respective precharge levels to the high level of $V_{cc}$ and the low level of ground. At this time, the read operation for sensing a potential difference between bit lines BLi and BLj is started.

On the other hand, when switching control signals φSAi and φSAj are shifted to a high level, transistors Q39 and Q40 are turned on.

If the memory cell selected by word line signal WL is an on-cell, namely an erased cell, the amount of current flowing through transistor Q37 becomes more than that flowing through transistor Q38. This is because bit line BLj has a higher potential than bit line BLi. Accordingly, sub-bit line SBLi is discharged faster than SBLj, so that the potential of SBLI is lower than that of SBLj. Transistors Q41 and Q44 are then turned on by latch driving lines $V_{sal}$ and $V_{sah}$, resulting in the development of voltages of sub-bit lines SBLi and SBLj, respectively, to GND and $V_{cc}$. As a result, the minute potential difference between the bit lines BLi and BLj is sensed and amplified by the sense amplifier circuit.

On the contrary, if the selected memory cell is an off-cell, namely a programmed cell, the amount of current flowing through transistor Q38 becomes more than that flowing through transistor Q37. This is because bit line BLj has a higher potential than bit line BLi. Accordingly, sub-bit line SBLj is discharged faster than SBLi, so that the potential of SBLj is lower than that of SBLi. Sub-bit lines SBLj and SBLi change, respectively, to GND and $V_{cc}$. As a result, the minute potential difference between bit lines BLi and BLj is sensed and amplified by the sense amplifier circuit.

Similarly to the first embodiment, switching control signals φSAi, φSAj have pulse waveforms, as shown in FIG. 12, so as not to continuously form a DC current path from precharged sub-bit lines SBLi and SBLj through voltage-controlled current source 22 and switching section 23 to GND (that is the signal line VSA) by developed bit lines BLi and BLj after a substantial sensing operation. Also, because isolation control signals ISOi and ISOj are inactivated and maintained at GND during the sensing operation, bit lines BLi and BLj are electrically and completely decoupled from the sense amplifier circuit, so that a stable sensing operation is performed with greater sensing speed and reduced current consumption.

Figure 13:
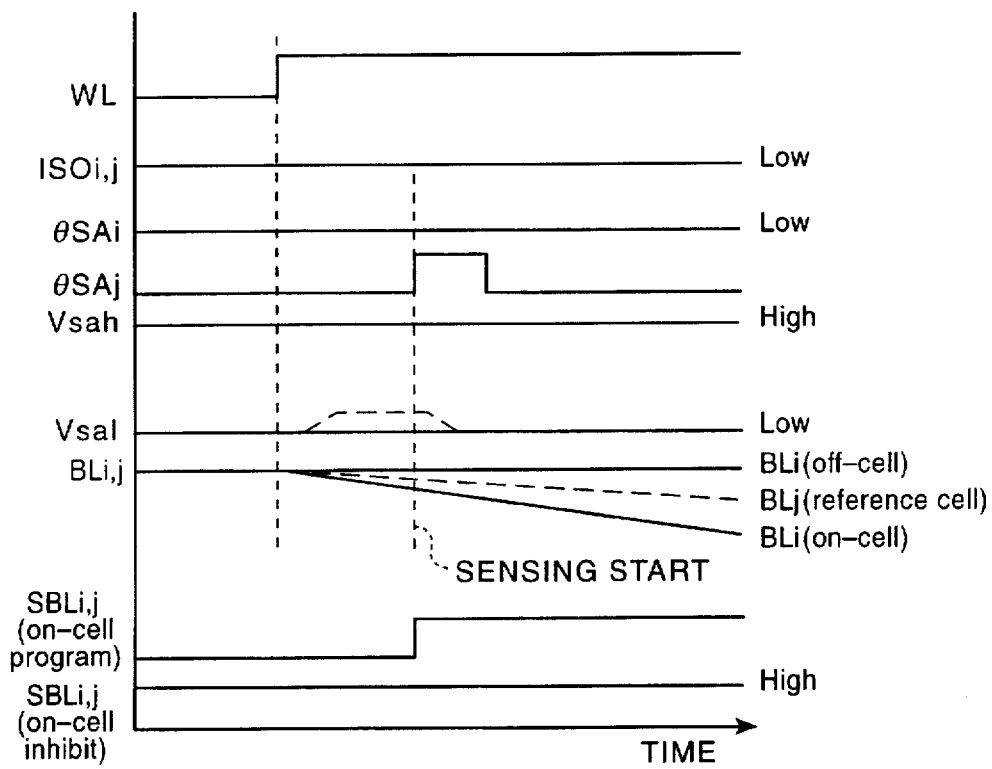
FIG. 13 is a timing chart showing the sensing operation in program verification and inhibition modes of the sense amplifier shown in FIG. 11.

FIG. 13 is a timing chart illustrating the sensing operation of the sense amplifier circuit of FIG. 11 for program verification and inhibition.

As shown in FIG. 13, in order that the on-cell connected to the selected bit line BLi is not programmed, sub-bit line SBLi corresponding to bit line BLi has to be maintained at $V_{cc}$. During the program inhibition, sub-bit lines SBLi and SBLj are precharged, respectively, to $V_{cc}$ and GND when latch sense amplifier sections 24 and 25 hold the external data signals from I/O gate circuit 200. Then, isolation control signals ISOi and ISOj are inactivated, and therefore the read operation, or the sensing operation is performed. At this time, with the activation of only switching control signal φSAj, only transistor Q40 in switching section 23 is turned on. The unselected sub-bit line SBLj is precharged to GND and latch driving signals $V_{sal}$ and $V_{sah}$ are at an active state. On the contrary, driving signal $V_{sal}$ of n-latch sense amplifier section 24 is temporarily at an inactive state and changes to an active state when switching control signal φSAj is activated.

During the following read operation, because sub-bit line SBLj is maintained at GND, the potential of sub-bit line SBLi continues to be maintained at $V_{cc}$ during the following sensing operation, even though the voltage of selected bit line BLi is developed to a low level. Therefore, sub-bit line SBLi continues to be maintained at $V_{cc}$ for the program inhibition of the selected on-cell.

The programming operation of on-cells (that is, erased cells) will now be described, assuming that the on-cells are connected to the selected bit line BLi and the selected bit line BLi is maintained at GND during the programming operation.

Sub-bit lines SBLi and SBLj are precharged, respectively, to GND and $V_{cc}$ by the external data signals from I/O gate circuit 200, and then the same operation, as in program verification which is well-known in the art, is carried out. If the selected cell is sufficiently programmed during the programming operation, that is, bit line BLj is higher than a reference voltage, the conductivity of transistor Q38 is higher than that of transistor Q37. In other words, when switching control signal φSAj is at active state under the sufficiently programmed condition, a current flowing from sub-bit line SBLj through transistor Q38 of latch amplifier 22 to ground rapidly increases. Sub-bit line SBLj then is sufficiently discharged to GND. Thus, if sub-bit line SBLi is shifted from GND to $V_{cc}$ by latch sense amplifier sections 24 and 25, the sense amplifier circuit is in the program inhibition and the programming operation for the selected on-cell is automatically terminated.

As described above, so as to carry out the program verification and inhibition, because there is no need for previously making isolation transistor Q36 connected to the reference bit line conductive, it is not necessary to prepare additional control logic for turning on isolation transistor Q36. Compared with the conventional sense amplifier, the memory device of the present invention in which the sense amplifier circuit is embodied has a simplified construction and saves time required for program verification and inhibition.

On the other hand, only transistor Q31 of bit line isolation section 21 is turned on so as to transmit the potential of sub-bit line SBLi precharged by the external data signal to bit line BLi, and only precharged transistor Q33 is turned on for the program inhibition of the cell connected to the unselected bit line BLj, whereby bit line BLj is precharged to $V_{cc}$.

As described above, the sense amplifier circuit according to the second embodiment may perform a stable sensing operation without providing bit line pulse isolation signals to the bit line isolation section. Also the time required for program verification and inhibition can be reduced.

EXAMPLE 3

Figure 14:
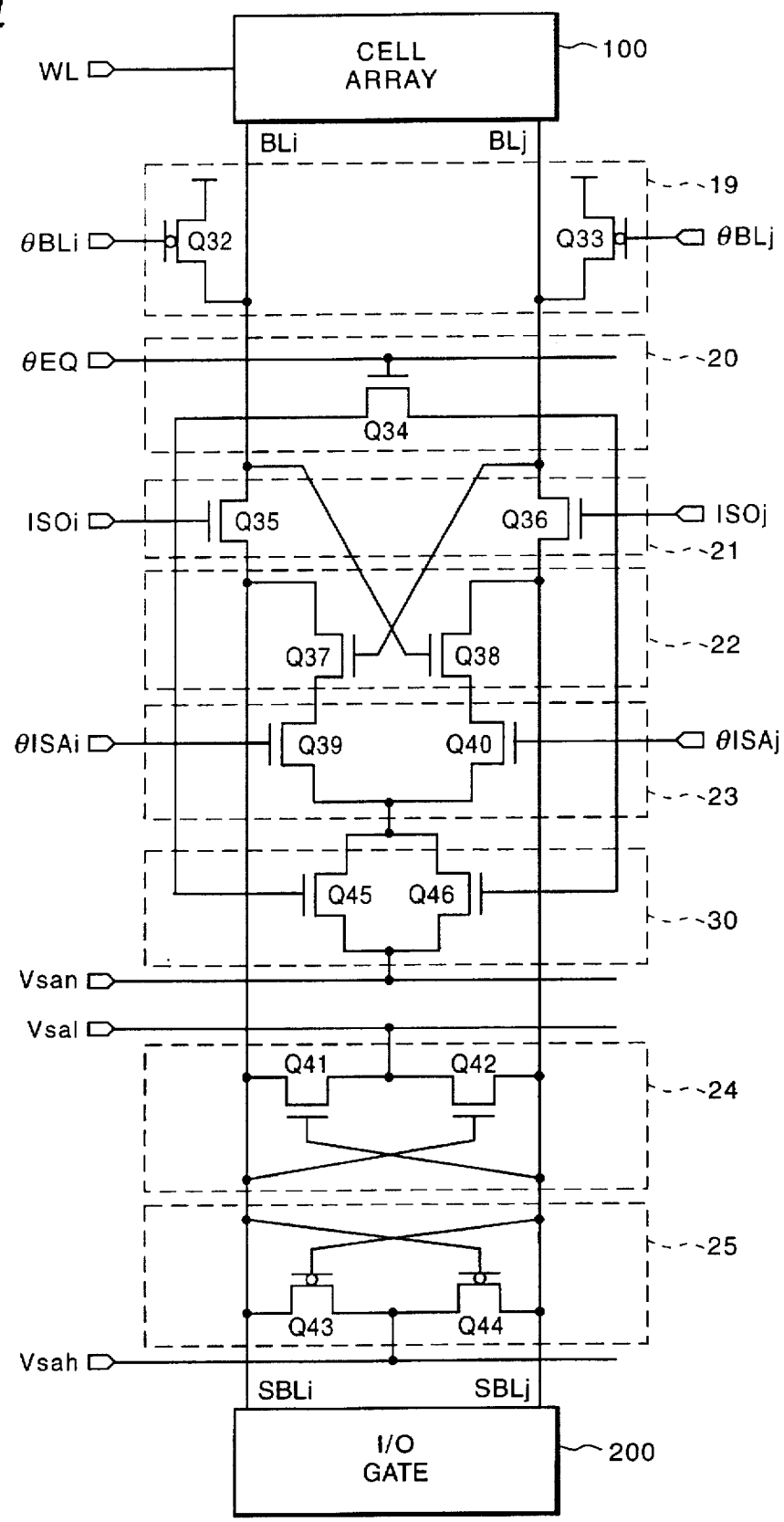
FIG. 14 is a circuit diagram showing the construction of a sense amplifier for a nonvolatile semiconductor memory device in accordance with a further embodiment of the present invention.

FIG. 14 shows a sense amplifier circuit for a flash memory device with folded bit line architecture, according to a third embodiment of the present invention. The sense amplifier circuit of FIG. 14 has the same construction as that of FIG. 11 except that additional voltage-controlled current source 30, having n-channel MOS transistors Q45 and Q46, is located between switching section 23 and signal line $V_{san}$. Component elements having similar functions to the component elements of the sense amplifier circuit of the second embodiment (shown in FIG. 11) are indicated by the same reference numerals, and accordingly, the descriptions thereof have been omitted.

As shown in FIG. 14, the drains of the transistors Q45 and Q46 are connected to each other, and the sources are also mutually connected. The sources of transistors Q39 and Q40 are connected to the drains of transistors Q45 and Q46, and the sources are commonly connected to signal line $V_{san}$. The gates of transistors Q45 and Q46 are connected, respectively, to bit lines BLi and BLj.

Figure 15:
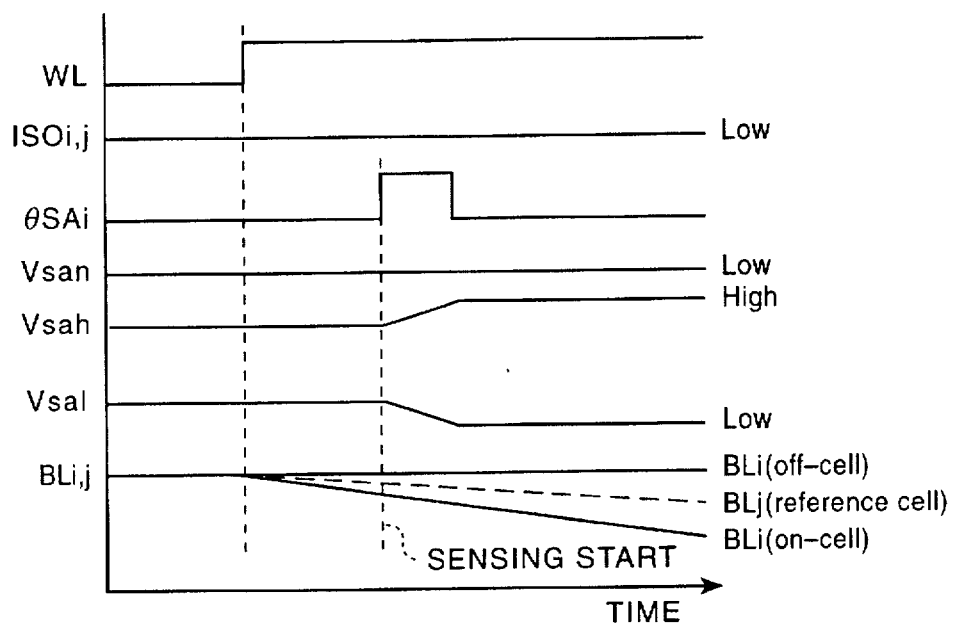
FIG. 15 is a timing chart showing the sensing operation in a read mode of the sense amplifier shown in FIG. 14.

As shown in FIG. 15, a timing chart is illustrated to describe the sensing operation of the sense amplifier circuit during the read operation. The memory cell is selected according to the shift of the word line signal to a high level after its precharging and equalizing operation, and a potential difference between bit lines BLi and BLj is generated according to the state of the selected cells, as shown in FIG. 15. Then, switching control signals φSAi and φSAj are at an active state, and p-latch sense amplifier driving line $V_{sah}$ and n-latch sense amplifier driving line $V_{sal}$ are shifted from precharge levels, respectively, to a high level and a low level. The read operation sensing a very small difference between the voltage levels on bit lines BLi and BLj is started. During the sensing operation, sufficient gate bias is applied to transistors Q45 and Q46 of voltage-controlled current source 30 by signal line $V_{san}$ which continues to be maintained at GND, and transistors Q39 and Q40 are turned on when switching control signals φSAi and φSAj are shifted to a high level. The rest of the read operation in the sense amplifier circuit is the same as that described with respect to the second embodiment and accordingly, its description has been omitted here.

Similarly to the second embodiment, switching control signals φSAi, φSAj have pulse waveforms, as shown in FIGS. 12 and 15, so as not to continuously form a DC current path from sub-bit lines SBLi and SBLj through voltage-controlled current source 22 and switching section 23 to ground by developed bit lines BLi and BLj during the substantial sensing operation. Also, because isolation control signals ISOi and ISOj are inactivated and maintained at GND during the sensing operation, bit lines BLi and BLj are electrically and completely decoupled from sub-bit lines SBLi and SBLj, so that a stable sensing operation can be carried out at a greater sensing speed and current consumption can be reduced.

Figure 16:
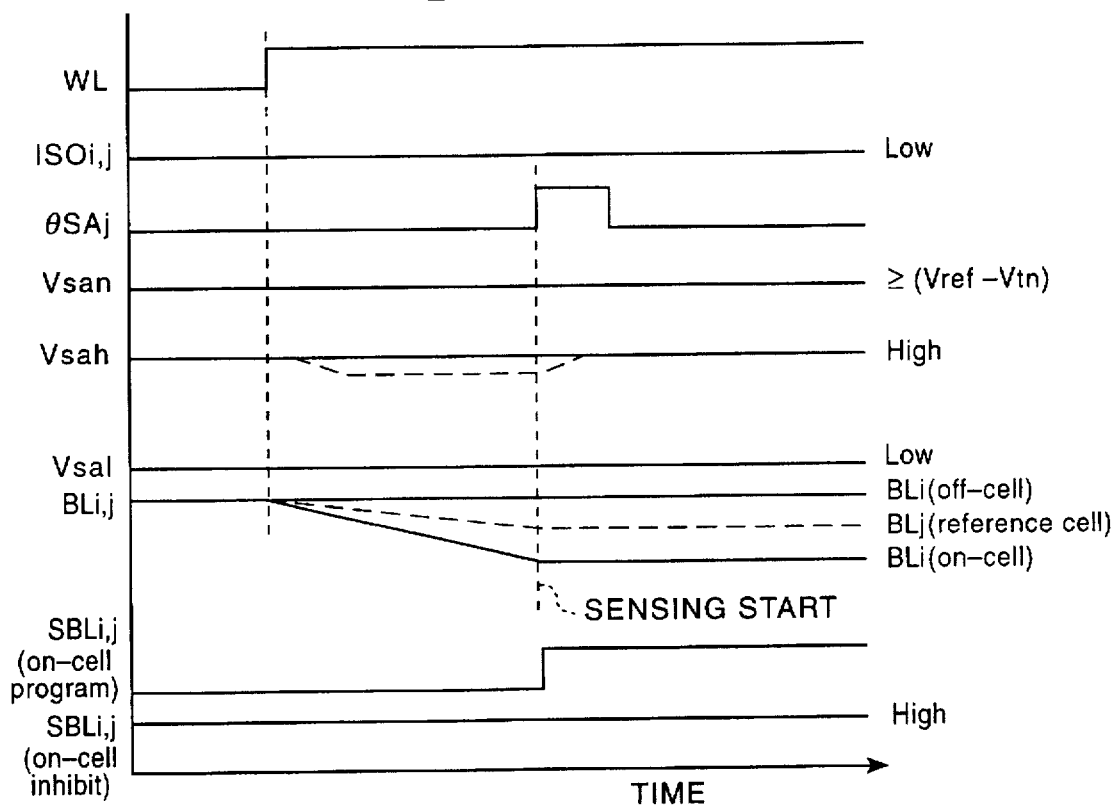
FIG. 16 is a timing chart showing the sensing operation in program verification and inhibition modes of the sense amplifier of FIG. 14.

FIG. 16 is a timing chart illustrating the sensing operation of the sense amplifier circuit of FIG. 14 for program verification and inhibition.

In order that the on-cell connected to the selected bit line BLi is not programmed, a read operation is performed by the external data signal from I/O gate circuit 200 under the condition that sub-bit lines SBLi and SBLj are precharged, respectively, to $V_{cc}$ and ground. Then, a voltage slightly higher than reference voltage $V_{ref}$ minus threshold voltages of transistor Q45 or Q46 ($V_m$) is applied to signal line $V_{san}$, so that transistors Q45 and Q46 respectively connected to bit lines BLi and BLj through the gates thereof are both turned off. As a result, sub-bit lines SBLi and SBLj continue to be maintained at precharge levels, that is, respectively, $V_{cc}$ and GND, and thereby the programming operation for the selected on-cell is inhibited.

On the contrary, driving signal $V_{sah}$ of the p-latch sense amplifier section is temporarily inactivated and changes to activated when switching control signal φSAi is at an active state, as shown in FIG. 16. During the following programming operation for the on-cell (namely, erased cell) connected to the selected bit line BLi, the same operation as in the program verification mode is performed after sub-bit lines SBLi and SBLj are precharged, respectively, to GND and $V_{cc}$ by the external data signal from the I/O gate circuit 200. If the selected cell is sufficiently programmed and bit line BLi has a potential greater than $V_{san}+V_m$, transistor Q45 is turned on. If the selected cell is sufficiently programmed and switching control signal φSAj is at an active state, sub-bit line SBLj is sufficiently discharged to be maintained at ground. Then, the program inhibition for the selected on-cell is performed and the programming operation is automatically terminated when sub-bit line SBLi is shifted from GND to $V_{cc}$ by the latch sense amplifier sections 24 and 25.

Although exemplary embodiments have been described in detail above, those skilled in the art will appreciate that many variations and modifications may be made without departing from the novel and advantageous features of the invention. Moreover, the present invention is by no means limited to the particular components described above, but rather, could be implemented in a variety of other ways. Accordingly, all such variations and modifications are intended to be included within the scope of the claims.

What is claimed is:

1. A sense amplifier circuit of a nonvolatile semiconductor memory device having an NAND structured memory cell array for storing information and a reference cell array for providing a reference voltage, said circuit comprising:

a pair of bit lines connected to said NAND structured memory cell array and said reference cell array, respectively;

a pair of sub-bit lines corresponding to said bit lines, respectively;

bit line isolating means for electrically and selectively isolating said bit lines from said sub-bit lines in response to an externally applied isolation control signal during a precharging period and a sensing period;

means for precharging and equalizing said sub-bit lines during the precharging period;

a signal line for receiving an externally applied voltage signal;

a voltage-controlled current source having first and second current paths connected to said sub-bit lines, respectively, for adjusting a current amount flowing through said second current path in accordance with a voltage level of one of said bit lines and adjusting a current amount flowing through said first current path in accordance with a voltage level of the other of said bit lines;

switching means for electrically and selectively connecting at least one of said first and second current paths to said signal line in response to a switching control signal; and amplifier means for amplifying voltage levels of said sub-bit lines to first and second predetermined voltage levels, respectively, when a potential difference between said sub-bit lines is more than a predetermined voltage.

2. The sense amplifier circuit as defined in claim 1, wherein said voltage-controlled current source comprises a first n-channel MOS transistor having a source-drain channel connected to one of said sub-bit lines and a gate connected to the other of said bit lines, and a second n-channel MOS transistor having a source-drain channel connected to the other of said sub-bit lines and a gate connected to the one of said bit lines.

3. The sense amplifier circuit as defined in claim 2, wherein said switching means comprises a first MOS transistor having a source-drain channel connected between said signal line and said source-drain channel of said first n-channel MOS transistor and a gate for receiving said switching control signal, and a second MOS transistor having a source-drain channel connected between said signal line and said source-drain channel of said second n-channel MOS transistor and a gate for receiving said switching control signal.

4. The sense amplifier circuit as defined in claim 3, wherein said switching control signal is a pulse signal having a pulse duration occurring after the starting of a sensing operation.

5. The sense amplifier circuit as defined in claim 4, wherein said amplifier means comprises a third n-channel MOS transistor having a source-drain channel connected between a first driving line for receiving a first driving voltage signal and the one of said sub-bit lines and a gate connected to the other of said sub-bit lines, a fourth n-channel MOS transistor having a source-drain channel connected between the first driving line and the other of said sub-bit lines and a gate connected to the one of said sub-bit lines, a first p-channel MOS transistor having a source-drain channel connected between a second driving line for receiving a second driving voltage signal and the one of said sub-bit lines and a gate connected to the other of said sub-bit lines and a second p-channel MOS transistor having a source-drain channel connected between said second driving line and the other of said sub-bit lines and a gate connected to the one of said sub-bit lines.

6. The sense amplifier circuit as defined in claim 5, wherein said precharging and equalizing means comprises means for precharging each of said sub-bit lines to a source voltage level.

7. The sense amplifier circuit as defined in claim 6, wherein said externally applied voltage signal is maintained to a ground voltage level during said precharging and sensing periods.

8. The sense amplifier circuit as defined in claim 7, wherein said first driving voltage signal is maintained to said source voltage level during said precharging period and to said ground voltage level during said sensing period, and wherein said second driving voltage signal is maintained to said source voltage level during said precharging and sensing periods.

9. The sense amplifier circuit as defined in claim 5, wherein said precharging and equalizing means comprises means for precharging each of said sub-bit lines to a ground voltage level.

10. The sense amplifier circuit as defined in claim 9, wherein said externally applied voltage signal is maintained to a source voltage level during said precharging and sensing periods.

11. The sense amplifier circuit as defined in claim 10, wherein said first driving voltage signal is maintained to said ground voltage level during said precharging and sensing periods, said second driving voltage signal is maintained to said ground voltage level during said precharging period and to said source voltage level during said sensing period.

12. A sense amplifier circuit of a nonvolatile semiconductor memory device having an NAND structured memory cell array for storing information and a reference cell array for providing a reference voltage, said circuit comprising:

a pair of bit lines connected to said NAND structured memory cell array and said reference cell array respectively; means for precharging and equalizing said bit lines during a precharging period;

a pair of sub-bit lines corresponding to said bit lines, respectively, and precharged by externally applied data signals;

bit line isolating means for electrically and selectively isolating said bit lines from said sub-bit lines in response to an externally applied isolation control signal during the precharging period and a sensing period;

a voltage-controlled current source having first and second current paths connected to said sub-bit lines, respectively, for adjusting a current amount flowing through said second current path in accordance with a voltage level of one of said bit lines and adjusting a current amount flowing through said first current path in accordance with a voltage level of the other of said bit lines;

a constant voltage source for supplying a constant voltage signal;

switching means for electrically and selectively connecting at least one of said first and second current paths to said constant voltage source in response to first and second switching control signals, respectively; and amplifier means for amplifying voltage levels of said sub-bit lines to first and second predetermined voltage levels, respectively, when a potential difference between said sub-bit lines is more than a predetermined voltage.

13. The sense amplifier circuit as defined in claim 12, wherein said voltage-controlled current source comprises a first n-channel MOS transistor having a source-drain channel connected to one of said sub-bit lines and a gate connected to the other of said bit lines, and a second n-channel MOS transistor having a source-drain channel connected to the other of said sub-bit lines and a gate connected to the one of said bit lines.

14. The sense amplifier circuit as defined in claim 13, wherein said switching means comprises a first MOS transistor having a source-drain channel connected between said constant voltage source and said source-drain channel of said first n-channel MOS transistor and a gate for receiving said first switching control signal, and a second MOS transistor having a source-drain channel connected between said constant voltage source and said source-drain channel of said second n-channel MOS transistor and a gate for receiving said second switching control signal.

15. The sense amplifier circuit as defined in claim 14, wherein said amplifier means comprises a third n-channel MOS transistor having a source-drain channel connected between a first driving line for receiving a first driving voltage signal and the one of said sub-bit lines and a gate connected to the other of said sub-bit lines, a fourth n-channel MOS transistor having a source-drain channel connected between the first driving line and the other of said sub-bit lines and a gate connected to the one of said sub-bit lines, a first p-channel MOS transistor having a source-drain channel connected between a second driving line for receiving a second driving voltage signal and the one of said sub-bit lines and a gate connected to the other of said sub-bit lines, and a second p-channel MOS transistor having a source-drain channel connected between said second driving line and the other of said sub-bit lines and a gate connected to the one of said sub-bit lines.

16. The sense amplifier circuit as defined in claim 15, wherein said precharging and equalizing means comprises means for precharging each of said sub-bit lines to a source voltage level.

17. The sense amplifier circuit as defined in claim 16, wherein the constant voltage signal si maintained to a ground voltage level during the precharging and sensing periods.

18. The sense amplifier circuit as defined in claim 17, wherein the first driving voltage signal is maintained to said source voltage level during the precharging period and to said ground voltage level during the sensing period, and wherein the second driving voltage signal is maintained to the ground voltage level during the precharging period and to the source voltage level during the sensing period.

19. The sense amplifier circuit as defined in claim 18, wherein further comprising another voltage-controlled current source having third and fourth current paths connected in series between said switching means and said constant voltage source and in parallel with each other, for adjusting a current amount flowing through said third current path in accordance with a voltage level of the one of said bit lines during the sensing period and adjusting a current amount flowing through said fourth current path in accordance with a voltage level of the other of said bit lines.

20. The sense amplifier circuit as defined in claim 19, wherein each of the first and second switching control signals is a pulse signal having a pulse duration occurring after the starting of a sensing operation for data read.

21. The sense amplifier circuit as defined in claim 20, wherein the first driving voltage signal is maintained to the ground voltage level during the precharging and sensing periods for program verification and inhibition, and the second driving voltage signal is maintained to the source voltage level during the precharging period for program verification and inhibition.

22. The sense amplifier circuit as defined in claim 19, wherein the first switching control signal is maintained to to ground voltage level during the precharging and sensing periods for program verification and inhibition, and the second driving voltage signal is a pulse signal having a pulse duration occurring after the starting of a sensing operation for program verification and inhibition.

23. The sense amplifier circuit as defined in claim 12, wherein said bit line isolating means comprises means for electrically connecting the one of said bit lines to one of said sub-bit lines in response to the activation of the second switching control signal during a programming operation of an on-cell connected to the one of said bit lines.

* * * * *